United States Patent [19]
Xing et al.

[11] Patent Number: 5,982,665
[45] Date of Patent: Nov. 9, 1999

[54] NON-VOLATILE MEMORY ARRAY HAVING A PLURALITY OF NON-VOLATILE MEMORY STATUS CELLS COUPLED TO A STATUS CIRCUIT

[75] Inventors: Dongsheng Xing, Fremont; Simpson (ShinChu) Tao, San Jose; Frank (Fong-Long) Lin, Milpitas, all of Calif.

[73] Assignee: Silicon Storage Technology, Inc., Calif.

[21] Appl. No.: 09/280,255

[22] Filed: Mar. 29, 1999

[51] Int. Cl.⁶ ..................................... G11C 16/06
[52] U.S. Cl. .............. 365/185.11; 365/185.33; 365/185.23
[58] Field of Search .......... 365/185.11, 185.33, 365/185.23

[56] References Cited

U.S. PATENT DOCUMENTS 5,418,752   5/1995   Harari et al. .............................. 365/218
5,576,993   11/1996   Hong .................................. 365/185.29

*Primary Examiner*—Andrew Q. Tran
*Attorney, Agent, or Firm*—Richard L. Yin; Limbach & Limbach LLP

[57] ABSTRACT

A non-volatile memory device has a plurality of blocks each of which can be erased simultaneously. Each block has a plurality of sectors. A status byte comprising of non-volatile memory cells is associated with each sector. A status circuit receives signals stored in each of the status bytes and generates a status signal indicative of the status of the block.

8 Claims, 2 Drawing Sheets

NON-VOLATILE MEMORY ARRAY HAVING A PLURALITY OF NON-VOLATILE MEMORY STATUS CELLS COUPLED TO A STATUS CIRCUIT

TECHNICAL BACKGROUND

The present invention relates to a non-volatile memory device having a non-volatile memory array of the "flash" memory type wherein a block, comprising a plurality of sectors of flash memory cells, can be erased at the same time. More particularly, the present invention relates to such a memory array with a dedicated status circuit to determine the status of all the sectors within the same block to generate a status signal regarding the state of the memory device.

BACKGROUND OF THE INVENTION

Non-volatile memories such as flash memories are well known in the art. Typically, in the flash memory, a block comprising a plurality of sectors of memory cells are erased simultaneously. Each sector of memory cells comprises also a plurality of non-volatile memory cells. Further, in a flash memory array, status cells, also in the nature of non-volatile memory cells, store signals representing the status of the sector of memory cells to which they are associated. Thus, the status cells can indicate that the sector has been erased and therefore is ready for use, or is in use as a read-only status, or is a defect and should be discarded. Since only a block or a plurality of sectors of memory cells are erased at the same time, an erase operation is performed only when all sectors in the same block are denoted as ready to be erased.

Thus, it is important for the status cells associated with each sector within a block to be constantly checked. Typically, in the prior art, a microcontroller checks on the status cells associated with each sector. Since this requires considerable overhead for the microcontroller to constantly check the status of the sectors within a block, it is desirable to relieve the microcontroller of this overhead.

SUMMARY OF THE INVENTION

Accordingly, in the present invention, an array of non-volatile memory cells are arranged in a plurality of blocks with each block having a plurality of sectors. Each sector has a plurality of memory cells. A plurality of non-volatile memory status cells is provided with each status cell associated with a different one of the plurality of sectors for storing data indicative of the status of the memory cells of the sector with which the status cell is associated. An address bus supplies address signals to the memory device. A data bus supplies data signals to the memory device and receives data signals from the memory device. A control circuit controls the erasure or programming of a block of memory cells. A status circuit receives signals from a plurality of status cells associated with the same block and generates a status signal indicative of the status of the same block.

DETAILED DESCRIPTION OF THE DRAWINGS

Figure 1:
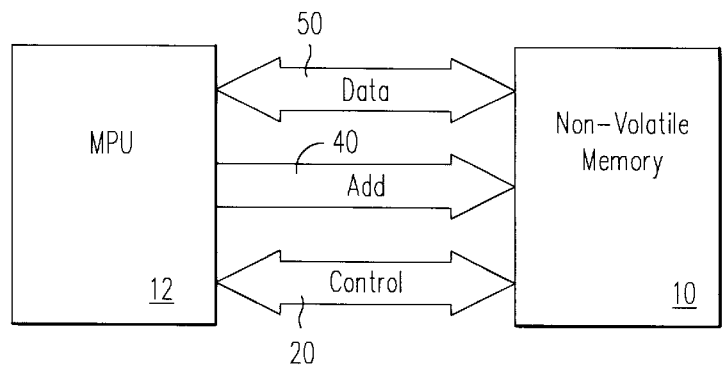
FIG. 1 is a block level diagram showing a non-volatile memory device of the present invention used with a microcontroller.

Referring to FIG. 1 there is shown a block level diagram of a non-volatile memory device 10 of the present invention for use with a microcontroller 12. In the embodiment shown in FIG. 1, the microcontroller 12 is "external" to the non-volatile memory device 10 and communicates with the non-volatile memory 10 through a data bus 50, an address bus 40, and a control bus 20. It should be understood that the present invention also contemplates a non-volatile memory device 10 in which the microcontroller 12 is an integral part thereof. Thus, both the non-volatile memory device 10 and the microcontroller 12 can be fabricated from the same semiconductor integrated circuit chip. However, for the ease of explanation of the present invention, the microcontroller 12 and the non-volatile memory device 10 are shown as being "separated".

Figure 2:
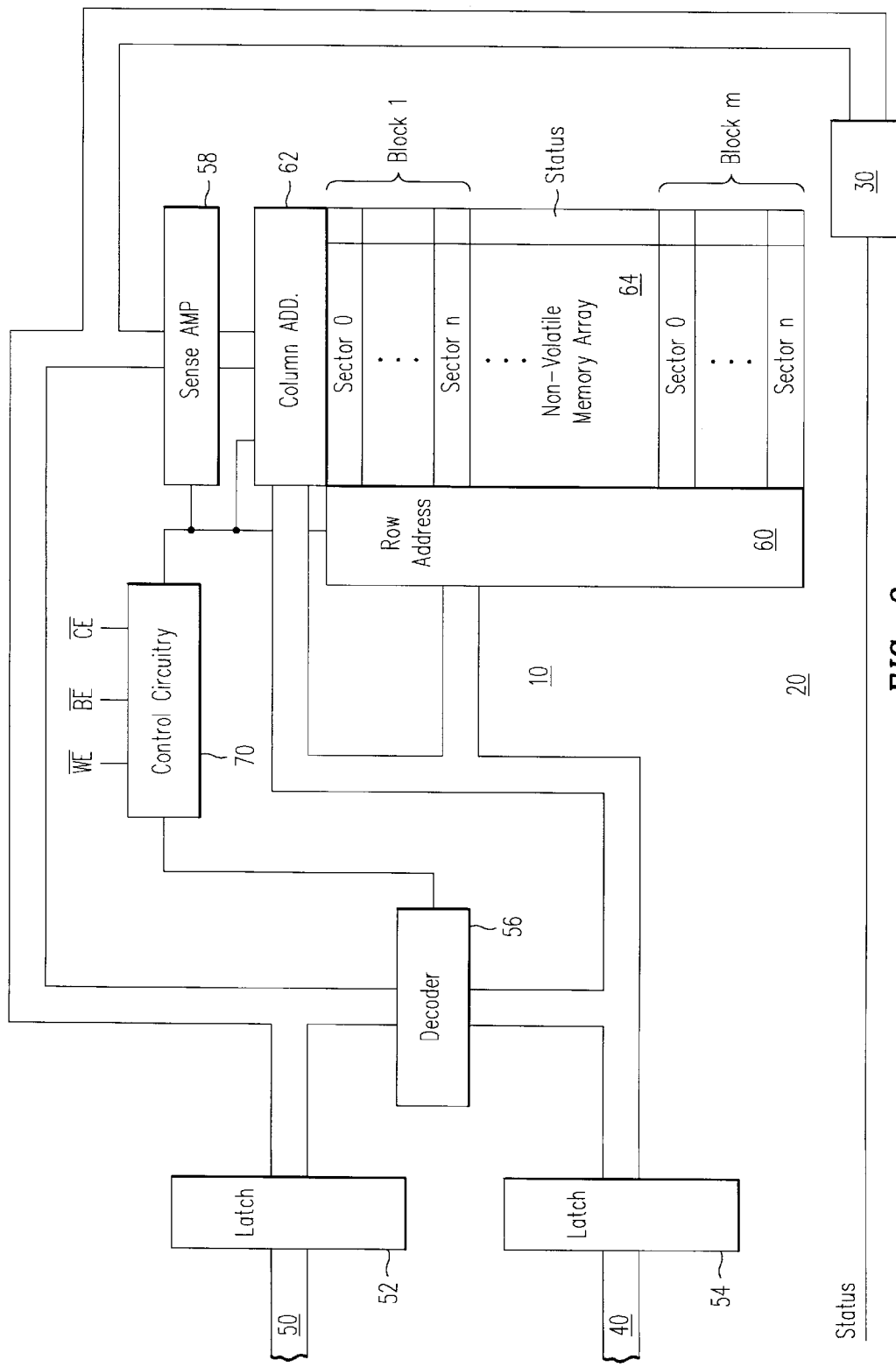
FIG. 2 is a detailed block level diagram of the non-volatile memory device shown in FIG. 1.

Referring to FIG. 2 there is shown a detailed block level diagram of the non-volatile memory device 10, shown in FIG. 1. The non-volatile memory device 10 receives data signals along the data bus 50. The data signals are supplied to the device 10 and are latched into a first latch 52. An address latch 54 is connected to the address bus 40 and receives the address signals from the address bus 40. A decoder 56 receives the address signals from the address latch 54 and/or the data signals from the data latch 52 and generates a decoded signal. As is well known in the art, typically, "commands" to the memory device 10 are transferred to the memory device 10 via data signals 50 and/or address signals 40. Thus, the decoder 56 upon the detection of a unique combination of data signals stored in the data latch 52 and/or address signals stored in the address latch 54 can determine whether or not it is a command for the memory device 10.

The data bus is connected to a sense amp 58. The address bus is connected to a column address decoder 62 and a row address decoder 60. The signals decoded by the decoder 56 control a control circuitry 70 which controls the sense amp 58, the column address decoder 62 and the row address decoder 60. Thus far, the foregoing circuitry is well known in the art.

The column address decoder 62 and the row address decoder 60 address a non-volatile memory array 64. The non-volatile memory array is divided into a plurality of blocks. In the embodiment shown in FIG. 2, M blocks are defined. Within each block is a plurality of sectors. In the embodiment shown in FIG. 2, there are n sections in each block with n being 16 in the preferred embodiment. Each sector has one or more status cells, also made of non-volatile memory cells, associated with that sector. In a preferred embodiment, there are eight (8) status cells for storing 8 bits associated with each sector.

The status cells are simply extensions of the memory cells in each sector. Thus, with each operation, such as read, program and erase, the status cells associated with the sector to which the operation is affected are also addressed by the column address decoder 62 and the row address decoder 60 and are read, programmed or erased. The data from the status cells are then supplied to a status circuit 30 of the present invention. From the status circuit 30, a plurality of control bits indicating the status of the addressed block can then be supplied external to the device 10.

Figure 3:
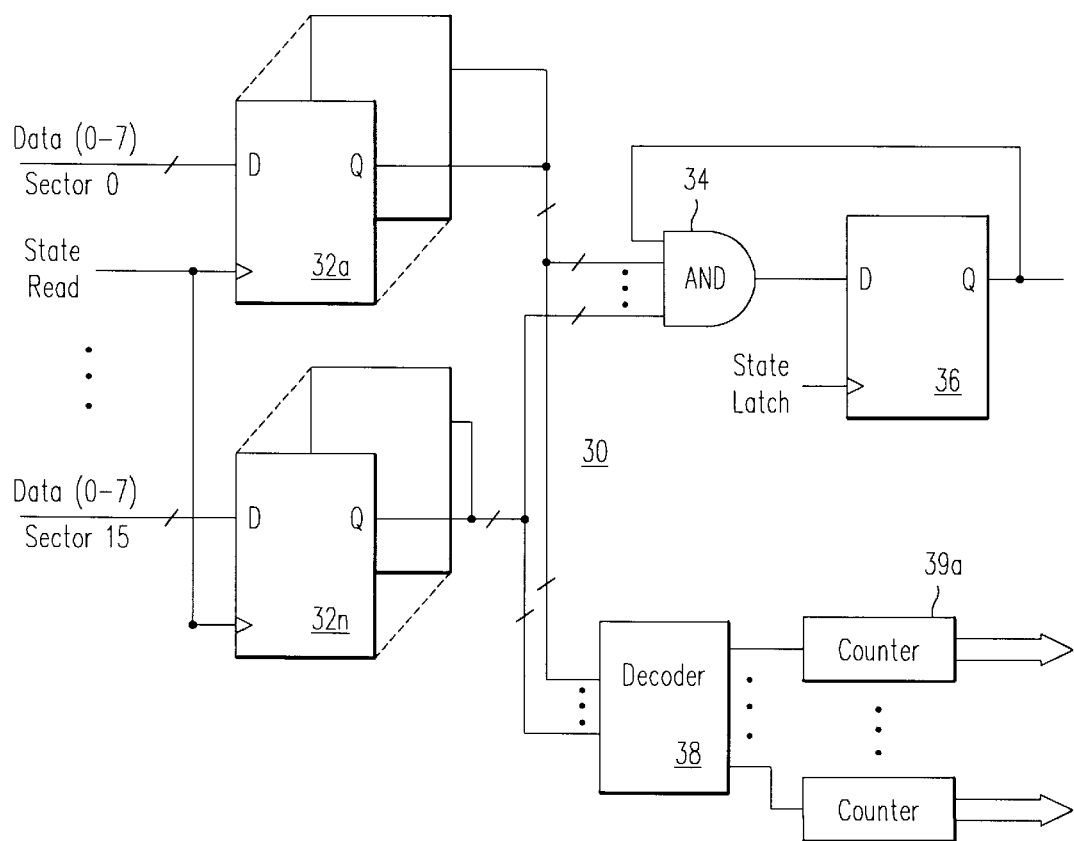
FIG. 3 is a circuit diagram of the status circuit shown in FIG. 2.

Referring to FIG. 3, there is shown a detailed circuit diagram of the status circuit 30. The status circuit 30 comprises a plurality of first latches 32(a . . . n) with each latch 32 for receiving a single status bit and for storing that status bit. All the status bits of a sector, and all sectors are latched into one of the first latches 32 by a state read signal. Since there are a number of possible combinations of the status cells that can be used to denote various status, the specific value of the status bit to denote a specific status is left up to the user. However, in one implementation, if all the status bits of a sector are "0", then this would indicate a used sector. If all the sectors are "used," then it is a "used block." Thus, the Q output of the first latches 32 are all combined by an AND gate 34. The output of the AND gate 34 is supplied to a second status latch 36. The Q output of the second latch 36 is connected in a feedback manner to the input of the AND gate 34. In this manner, if all of the status bits stored in the first latch 32 are "0", indicating a used block, then the Q output of the second latch 36 is also "0". This would indicate that the block from which the status cells are received, is a "used block". Alternatively, if all the status bits associated with a single sector are "1" then it indicates blank sector. If all the status bits of all the sectors are also "1" then the logical output of the AND gate 34 is a 1 indicating that the associated block is also a "blank block".

As previously discussed, one can define any value of the status byte to represent the status of the particular sector to which it is associated. For example, "55H" can be the hexadecimal representation of the sector as being "valid for data". Another possible representation is "AAH" for a valid byte for table. A third possibility is "00H" for abort. Finally, "88H" for a sector that is to be discarded.

Thus, the status bits stored in each of the first latch 32 are then supplied to a decoder 38. The decoder 38 determines whether the bit pattern stored in the byte latches 32(a–n) matches the preassigned value for the status of the sector. If that sector bit pattern matches a preassigned value, then one of the associated counters, e.g. 39a, is incremented. Each of the counters 39(a–n) keeps track of the numbers of sector within a block that has the particular sector status byte. For example, if each block comprises 16 sectors, and counter 39a is associated with the hex value "55H", at any particular time, a readout of counter 39a would indicate the number of sectors within a block that is "valid for data."

Therefore, from the foregoing, it can be seen that with the addition of the status circuit 30, this frees up the overhead of the microcontroller 12 from accessing the memory array 64 to check on the status of the various sectors.

What is claimed is:

1. A non-volatile memory device comprising:
   an array of non-volatile memory cells arranged in a plurality of groups, with each group having a plurality of subgroups, with each subgroup having a plurality of memory cells;
   a plurality of non-volatile memory status cells, with each status cell associated with a different one of said plurality of subgroups, for storing data indicative of the status of the memory cells of a subgroup with which the status cell is associated;
   an address bus coupled to said array for supplying address signals to said memory device;
   a data bus coupled to said array for supplying data signals to and for receiving data signals from said memory device;
   control circuitry coupled to said array for controlling the erasure of memory cells in the same group, and for controlling the programming of memory cells within a subgroup; and
   a status circuit coupled to said array for receiving signals from a plurality of status cells associated with the same group and for generating a status signal, indicative of the status of said same group.

2. The memory device of claim 1 wherein said status circuit further comprises:

a plurality of first latches for receiving signals from said status cells;
a combinatorial logic circuit for receiving signals from said plurality of first latches and for generating an output signal in response thereto; and
a second latch for storing said output signal.

3. The memory device of claim 1 wherein said status circuit further comprises:
   a plurality of first latches for receiving signals from said status cells;
   a decoder circuit for receiving signals from said plurality of first latches and for generating a plurality of output signals in response thereto; and
   a plurality of counters, each for receiving one of said output signal.

4. A non-volatile memory device comprising:
   an array of non-volatile memory cells arranged in a plurality of groups, with each group having a plurality of subgroups, with each subgroup having a plurality of memory cells;
   a plurality of non-volatile memory status cells, with each status cell associated with a different one of said plurality of subgroups, for storing data indicative of the status of the memory cells of a subgroup with which the status cell is associated;
   an address bus coupled to said array for supplying address signals to said memory device;
   a data bus coupled to said array for supplying data signals to and for receiving data signals from said memory device;
   a latch coupled to said address bus and said data bus for storing signals supplied from said address bus or said data bus;
   a decoder coupled to said latch for decoding said signal stored in said latch;
   control circuitry for controlling the writing of said array of memory cells in response to said decoder; and
   a status circuit coupled to said array for receiving signals from said plurality of status cells and for generating a status signal when a plurality of signals from the plurality of status cells associated with the same group are the same.

5. The memory device of claim 4 wherein said device is connected to a microcontroller.

6. The memory device of claim 4 further comprising a microcontroller as an integral part of said device.

7. The memory device of claim 4 wherein said status circuit further comprises:
   a plurality of first latches for receiving signals from said status cells;
   a combinatorial logic circuit for receiving signals from said plurality of first latches and for generating an output signal in response thereto; and
   a second latch for storing said output signal.

8. The memory device of claim 4 wherein said status circuit further comprises:
   a plurality of first latches for receiving signals from said status cells;
   a decoder circuit for receiving signals from said plurality of first latches and for generating a plurality of output signals in response thereto; and
   a plurality of counters, each for receiving one of said output signal.

* * * * *